United States Patent
Kim et al.

(10) Patent No.: US 8,258,542 B2
(45) Date of Patent: Sep. 4, 2012

(54) SEMICONDUCTOR DEVICES AND SEMICONDUCTOR APPARATUSES INCLUDING THE SAME

(75) Inventors: Won-joo Kim, Hwaseong-si (KR); Dae-kil Cha, Seoul (KR); Tae-hee Lee, Yongin-si (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 914 days.

(21) Appl. No.: 12/219,990

(22) Filed: Jul. 31, 2008

(65) Prior Publication Data

US 2009/0212320 A1  Aug. 27, 2009

(30) Foreign Application Priority Data

Feb. 27, 2008  (KR) .................. 10-2008-0017887

(51) Int. Cl.
  *H01L 29/66* (2006.01)
(52) U.S. Cl. ........................ 257/133; 257/135
(58) Field of Classification Search .................. 257/133, 257/135
See application file for complete search history.

(56) References Cited

U.S. PATENT DOCUMENTS 7,158,410 B2   1/2007 Bhattacharyya et al.
7,403,419 B2 *  7/2008 Bhattacharyya et al. ... 365/185.18

OTHER PUBLICATIONS

Chinese Office Action dated Dec. 7, 2011 in corresponding Chinese Application No. 200910001436.1.

* cited by examiner

*Primary Examiner* — Douglas Menz
(74) *Attorney, Agent, or Firm* — Harness, Dickey & Pierce, P.L.C.

(57) ABSTRACT

Semiconductor devices and semiconductor apparatuses including the same are provided. The semiconductor devices include a body region disposed on a semiconductor substrate, gate patterns disposed on the semiconductor substrate and on opposing sides of the body region, and first and second impurity doped regions disposed on an upper surface of the body region. The gate patterns may be separated from the first and second impurity doped regions by, or greater than, a desired distance, such that the gate patterns do not to overlap the first and second impurity doped regions in a direction perpendicular to the first and second impurity doped regions.

20 Claims, 24 Drawing Sheets

EXTENDING
DIRECTION OF
BODY LINE PATTERN

EXTENDING
DIRECTION OF
BODY LINE PATTERN

SEMICONDUCTOR DEVICES AND SEMICONDUCTOR APPARATUSES INCLUDING THE SAME

PRIORITY STATEMENT

This application claims the benefit of priority under 35 U.S.C. §119 from, Korean Patent Application No. 10-2008-0017887, filed on Feb. 27, 2008, in the Korean Intellectual Property Office, the disclosure of which is incorporated herein in its entirety by reference.

BACKGROUND

1. Field

Example embodiments relate to semiconductor devices and semiconductor apparatuses including the same. Other example embodiments relate to semiconductor devices having gate patterns, which are disposed on both sides of a body region, and semiconductor apparatuses including the same.

2. Description of the Related Art

Generally, a one transistor (1-T) dynamic random access memory (DRAM), which does not include a capacitor and is implemented using one transistor, has been used. A 1-T DRAM may be manufactured by performing a simple manufacturing operation. A 1-T DRAM may have an increased sensing margin.

FIG. 1 is a front view of a conventional one transistor (1-T) dynamic random access memory (DRAM), which is provided as a comparative example. FIG. 2 is a circuit diagram of the conventional 1-T DRAM illustrated in FIG. 1.

Referring to FIGS. 1 and 2, the conventional 1-T DRAM may be modeled as a bipolar junction transistor (BJT) structure. However, the conventional 1-T DRAM, for example, may have a metal-oxide-semiconductor (MOS) transistor structure. Thus, in the conventional 1-T DRAM, a gate pattern WL 130 may be disposed on a body region including impurity coated regions 140 and 150. Insulation regions 120a and 120b may be on a substrate region 110 and on sides of the impurity coated regions 140 and 150, respectively. A distance between the gate pattern WL 130 and the impurity coated regions 140 and 150 may be substantially small such that the impurity coated regions 140 and 150 are each in close proximity to the gate pattern WL 130. As such, a band-to-band tunneling (BTBT) phenomenon may occur. In the conventional 1-T DRAM, data may be damaged due to a repeated read operation or an increased retention time.

SUMMARY

Example embodiments relate to semiconductor devices and semiconductor apparatuses including the same. Other example embodiments relate to semiconductor devices having gate patterns, which are disposed on both sides of a body region, and semiconductor apparatuses including the same.

Example embodiments provide semiconductor devices including gate patterns, which are disposed on both sides of a body region and do not overlap impurity doped regions, and semiconductor apparatuses including the semiconductor devices.

According to example embodiments, there is provided a semiconductor device including a body region disposed on a semiconductor substrate, at least two gate patterns disposed on the semiconductor substrate and on both sides of the body region, and first and second impurity doped regions disposed on an upper surface of the body region.

The gate patterns may be separated from the first and second impurity doped regions by a desired distance (or greater than the desired distance). The gate patterns may be disposed in a direction perpendicular to the first and second impurity doped regions such that the gate patterns do not to overlap with the first and second impurity doped regions.

The gate patterns may be shared by neighboring (or adjacent) semiconductor devices of a semiconductor apparatus.

The first and second impurity doped regions may be connected to a source line and a bit line, respectively. The first and second impurity doped regions may be connected to the bit line and the source line, respectively.

The semiconductor device may be a bipolar junction transistor (BJT). If the semiconductor device is a bipolar junction transistor (BJT), then the gate patterns may be base regions of the BJT. The first and second impurity doped regions may be emitter and source regions of the BJT, respectively. The first and second impurity doped regions may be the source and emitter regions, respectively, of the BJT.

BRIEF DESCRIPTION OF THE DRAWINGS

Example embodiments will be more clearly understood from the following detailed description taken in conjunction with the accompanying drawings. FIGS. 1-20 represent non-limiting, example embodiments as described herein.

FIG. 1 is a front view of a conventional one transistor (1-T) dynamic random access memory (DRAM), which is provided as a comparative example;

FIG. 2 is a circuit diagram of the conventional 1-T DRAM illustrated in FIG. 1;

FIG. 3 is a front view of a semiconductor device 300 according to example embodiments;

FIG. 4 is a circuit diagram of the semiconductor device 300 illustrated in FIG. 3 according to example embodiments;

FIG. 5 is a graph showing bit line currents in accordance with the number of read operations in the conventional 1-T DRAM illustrated in FIG. 1 and the semiconductor device according to example embodiments;

FIG. 6 is a graph showing bit line currents in accordance with retention time in the conventional 1-T DRAM illustrated in FIG. 1 and the semiconductor device according to example embodiments;

FIG. 7 is a front view of an array 30 of semiconductor devices according to example embodiments;

FIG. 8 is a circuit diagram of the array 30 of semiconductor devices illustrated in FIG. 7 according to example embodiments;

FIG. 9 is a circuit diagram of an array of semiconductor devices according to example embodiments;

FIGS. 10 through 13 are diagrams for describing program and read operations of semiconductor devices according to example embodiments;

FIG. 15 is a front view of an array 50 of semiconductor devices according to example embodiments;

FIG. 17 is a front view of an array 70 of semiconductor devices according to example embodiments;

FIG. 19 is a perspective view of a semiconductor device 900 according to example embodiments; and FIG. 20 is a circuit diagram of an array of semiconductor devices according to example embodiments.

DETAILED DESCRIPTION OF EXAMPLE EMBODIMENTS

Figure 1:
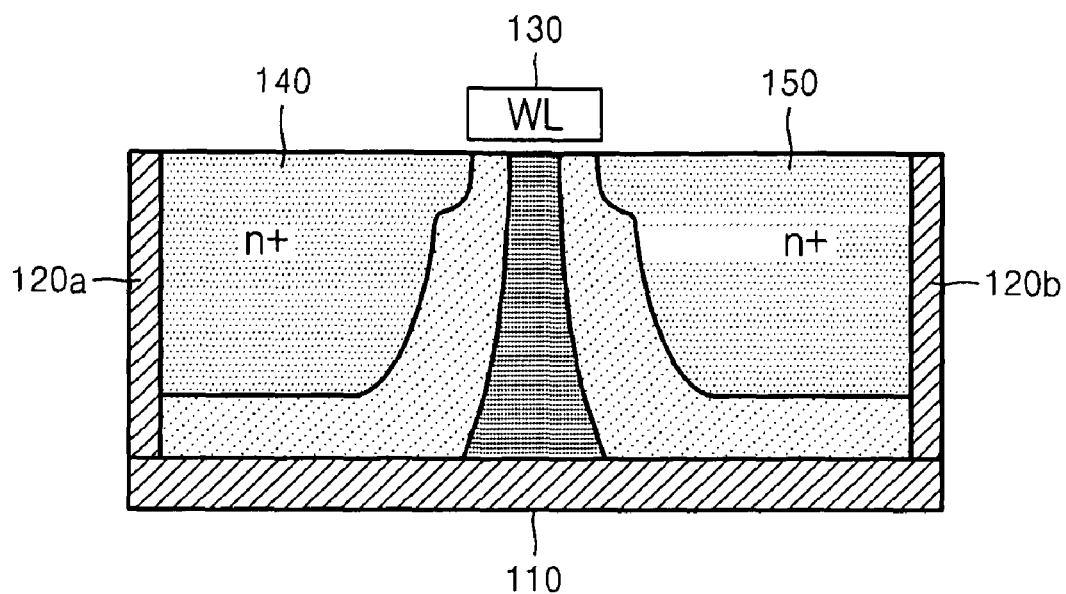
Figure 2:
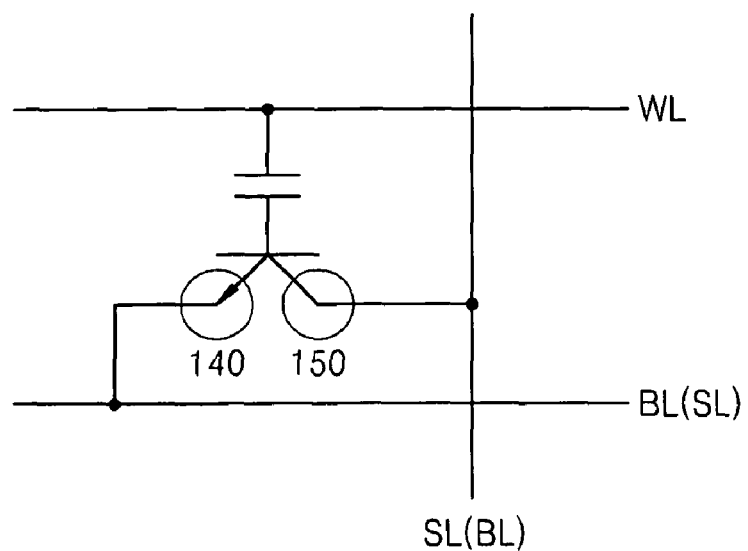

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to semiconductor devices and semiconductor apparatuses including the same. Other example embodiments relate to semiconductor devices having gate patterns, which are disposed on both sides of a body region, and semiconductor apparatuses including the same.

Figure 3:
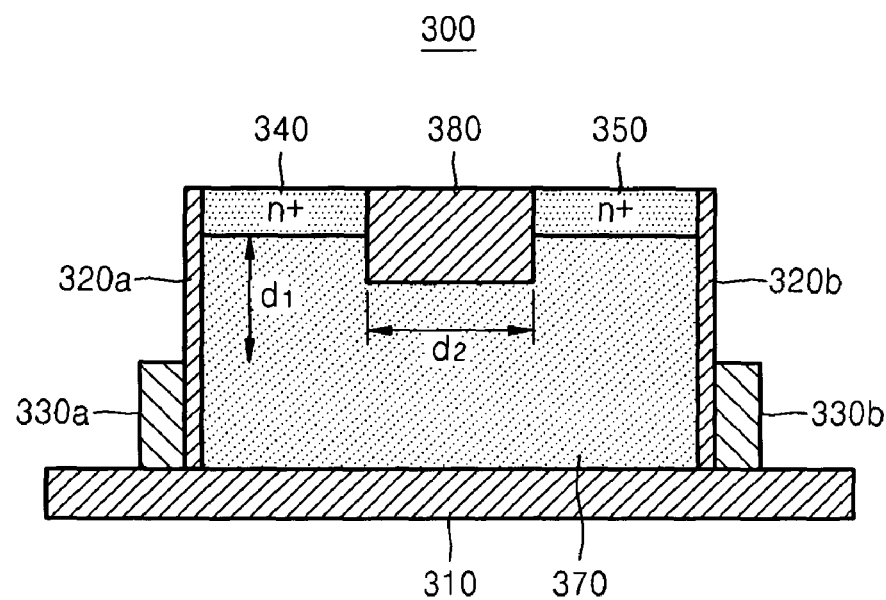

FIG. 3 is a front view of a semiconductor device 300 according to example embodiments.

Referring to FIG. 3, the semiconductor device 300 may include a substrate region 310, a body region 370, gate patterns 330a and 330b, a first impurity doped region 340 and/or a second impurity doped region 350.

The body region 370 may be disposed on the substrate region 310. The gate patterns 330a and 330b may be disposed on the substrate region 310. The gate patterns 330a and 330b may be on opposing sides of the body region 370, respectively. The first and second impurity doped regions 340 and 350 may be disposed on an upper surface of the body region 370.

In the semiconductor device 300, by disposing the gate patterns 330a and 330b on the opposing sides of the body region 370, a distance between the gate patterns 330a and 330b and the first and second impurity doped regions 340 and 350 may be increased. As such, the likelihood of the BTBT phenomenon occurring in a semiconductor device according to example embodiments may be reduced (or prevented).

In the semiconductor device 300, the gate patterns 330a and 330b may be separated from the first and second impurity doped regions 340 and 350 by a desired distance d₁ (or greater than the desired distance) in a direction perpendicular to the first and second impurity doped regions 340 and 350. As such, the gate patterns 330a and 330b may not overlap with the first and second impurity doped regions 340 and 350. As such, the BTBT phenomenon is less likely to occur.

The gate patterns 330a and 330b may extend in a first direction perpendicular to a width of the body region 370. A wide surface (or the width) of the body region 370 may extend in a second direction perpendicular to the first direction (or the direction in which the gate patterns 330a and 330b extend).

The first and second impurity doped regions 340 and 350 may be formed on (or protrude from) the upper surface of the body region 370. The first and second impurity doped regions 340 and 350 may be separated from each other by a desired distance d₂.

An insulation region may be disposed between the first and second impurity doped regions 340 and 350. The insulation region may be a blocking oxide region 380. The blocking oxide region 380 may be formed of a material including an oxide. The insulation region may be formed of any insulation material known in the art.

Hereinafter, it is assumed that the semiconductor device includes oxide insulation regions. However, example embodiments are not limited thereto. For example, the oxide insulation regions may be insulation regions formed of any insulation materials known in the art.

The semiconductor device 300 may include gate insulation regions 320a and 320b. The gate insulation region 320a may be disposed between the gate pattern 330a and the body region 370. The gate insulation region 320b may be disposed between the gate pattern 330b and the body region 370. The gate insulation regions 320a and 320b insulate the gate patterns 330a and 330b, respectively, from the body region 370.

The semiconductor device may include a buried oxide (BOX) region (not shown) formed on the substrate region 310. The BOX region may be formed by forming an oxide region on the substrate region 310 obtained from a bulk substrate. An insulation region of a silicon-on-insulator (SOI) substrate may be used as the BOX region.

Figure 4:
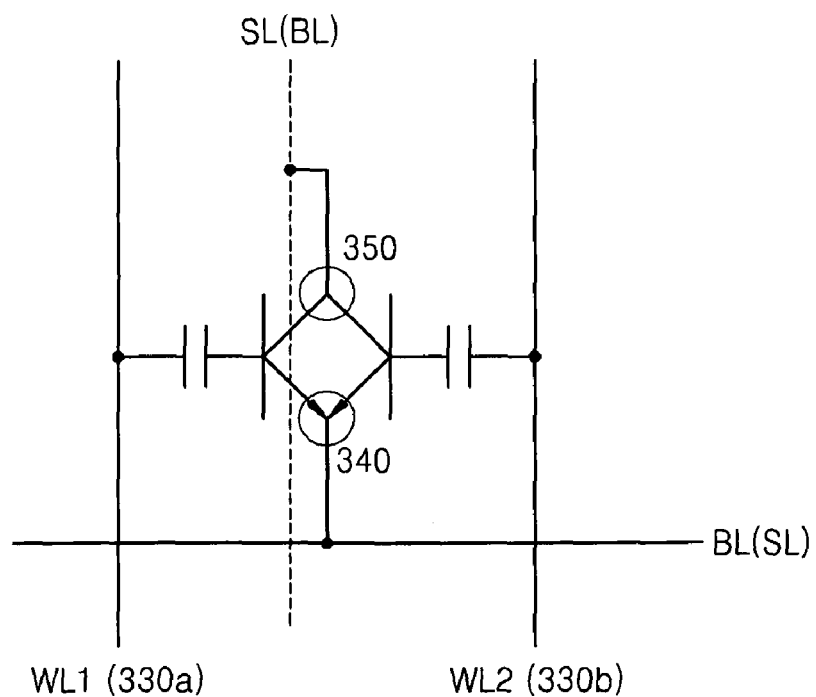

FIG. 4 is a circuit diagram of the semiconductor device 300 illustrated in FIG. 3. FIG. 4 will be described in conjunction with FIG. 3.

Referring to FIG. 4, in the semiconductor device 300, the first and second impurity doped regions 340 and 350 may be connected to a source line SL and a bit line BL, respectively. In other example embodiments, the first and second impurity doped regions 340 and 350 may be connected to the bit line BL and the source line SL, respectively.

The semiconductor device 300 may function as a bipolar junction transistor (BJT). The gate patterns 330a and 330b may be base regions of the BJT. The first and second impurity doped regions 340 and 350 may be emitter regions or source regions, respectively, of the BJT.

Figure 5:
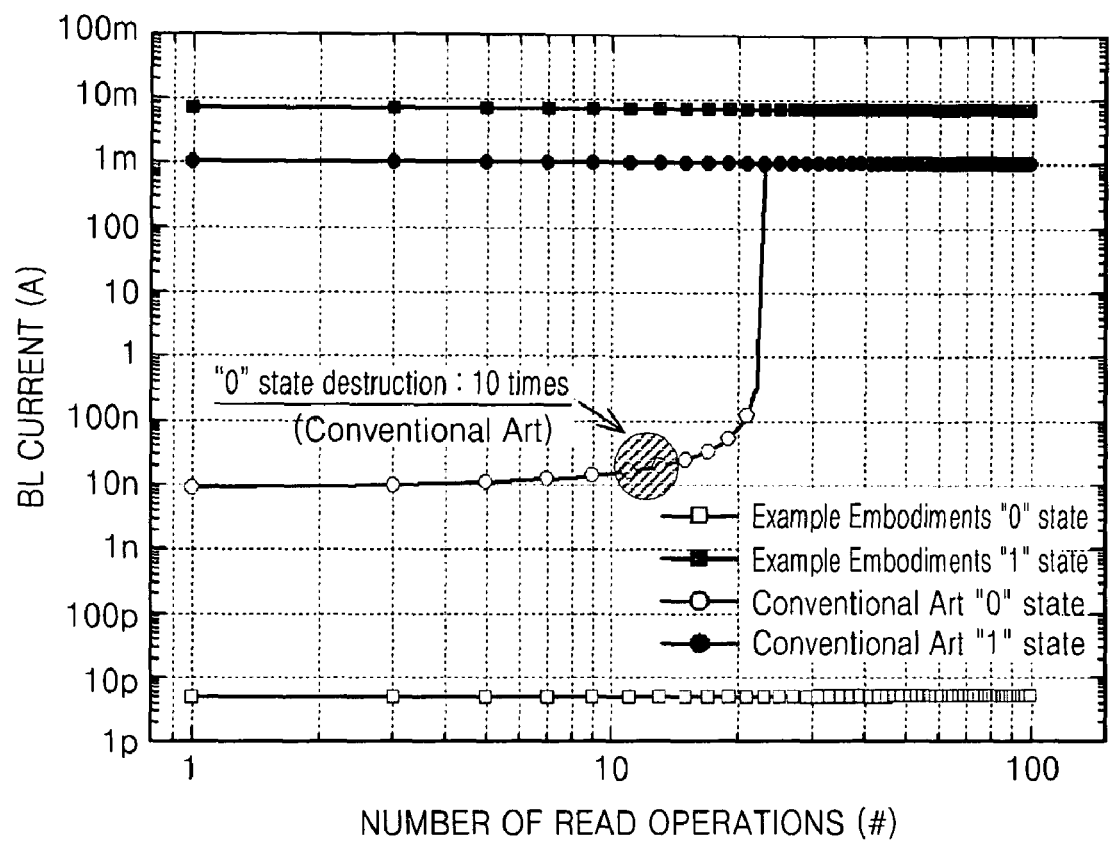

FIG. 5 is a graph showing bit line currents in accordance with the number of read operations in the conventional 1-T DRAM illustrated in FIG. 1 and the semiconductor device according to example embodiments.

Referring to FIG. 5, in the conventional 1-T DRAM, if a read operation is repeated ten times or more, a data state '0' is not distinguished from a data state '1'. In the semiconductor device according to example embodiments, although the read operation is repeated one hundred times, the data state '0' is clearly distinguished from the data state '1'.

Figure 6:
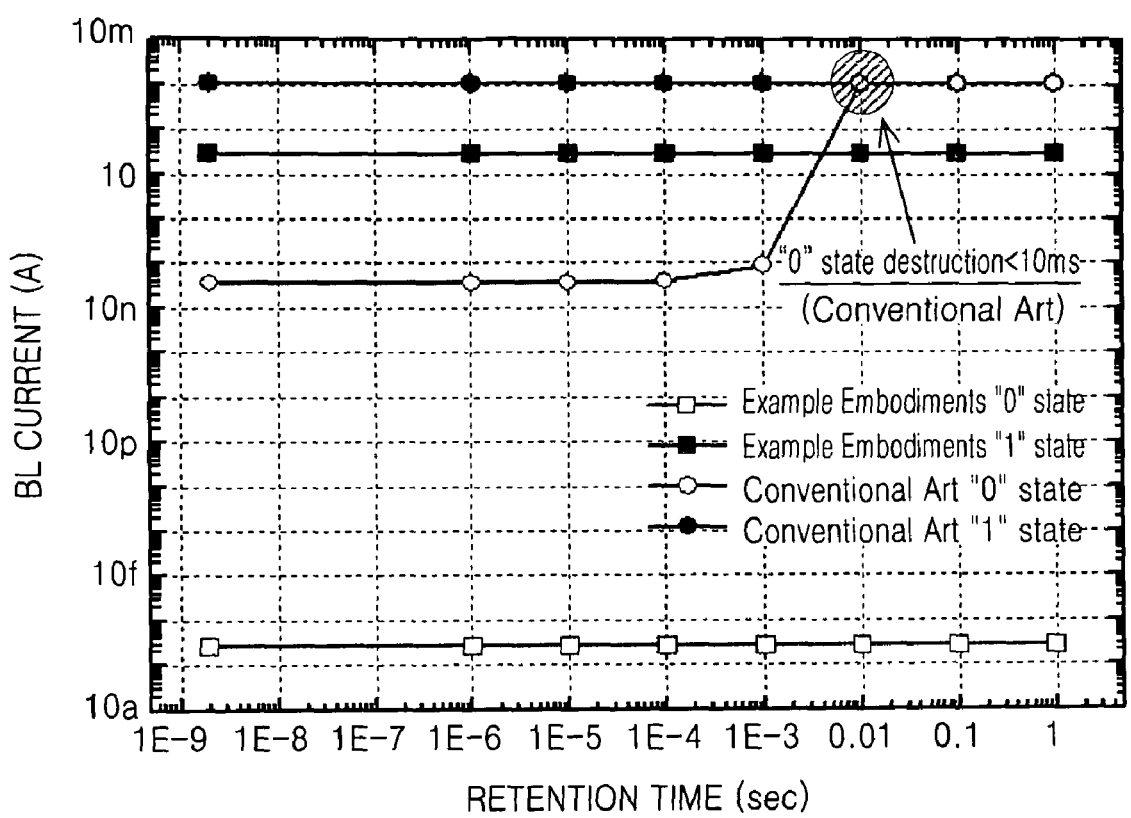

FIG. 6 is a graph showing bit line currents in accordance with retention time in the conventional 1-T DRAM illustrated in FIG. 1 and the semiconductor device according to example embodiments.

Referring to FIG. 6, in the conventional 1-T DRAM, if a retention time is 10 ms or more, a data state '0' is not distinguished from a data state '1'. In the semiconductor device according to example embodiments, although the retention time is 1 s, the data state '0' is clearly distinguished form the data state '1'.

Semiconductor devices according to example embodiments may be arranged in an array.

Figure 7:
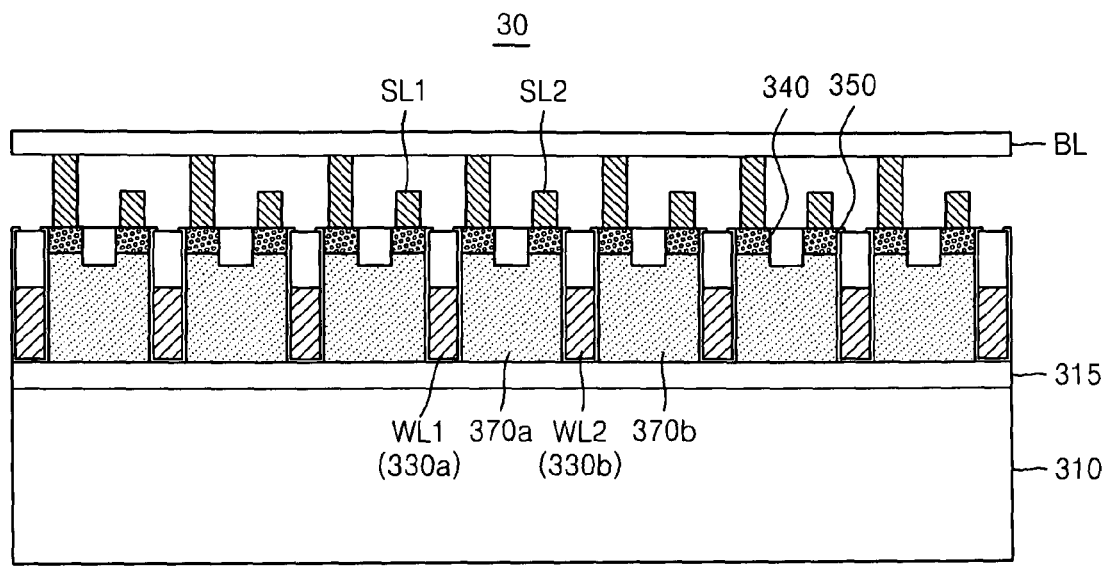

FIG. 7 is a front view of an array 30 of semiconductor devices according to example embodiments. The semiconductor devices shown in FIG. 7 are similar to semiconductor device 300 shown in FIG. 3. Thus, for the convenience of explanation, the same reference numerals used in FIG. 3 will be used in FIG. 7 for similar elements.

Referring to FIG. 7, a plurality of body regions 370a, 370b and a plurality of gate patterns WL1 330a and WL2 330b may be disposed on a semiconductor substrate 310. For convenience of explanation, the body regions 370a and 370b and the gate patterns WL1 and WL2 will be representatively described. The body regions 370a and 370b may be disposed on the semiconductor substrate 310 in an array. The gate pattern WL2 may be disposed between the body regions 370a and 370b. The gate pattern WL2 may be shared by the body regions 370a and 370b. The body region 370a and the gate patterns WL1 and WL2 may function as a semiconductor device.

As described above with reference to FIG. 3, the gate patterns WL1 and WL2 do not overlap first and second impurity doped regions 340 and 350 formed on the body region 370.

Because FIG. 7 is a front view of the array, only a first row of the semiconductor devices is shown. However, additional semiconductor devices may be disposed behind the first row.

Figure 8:
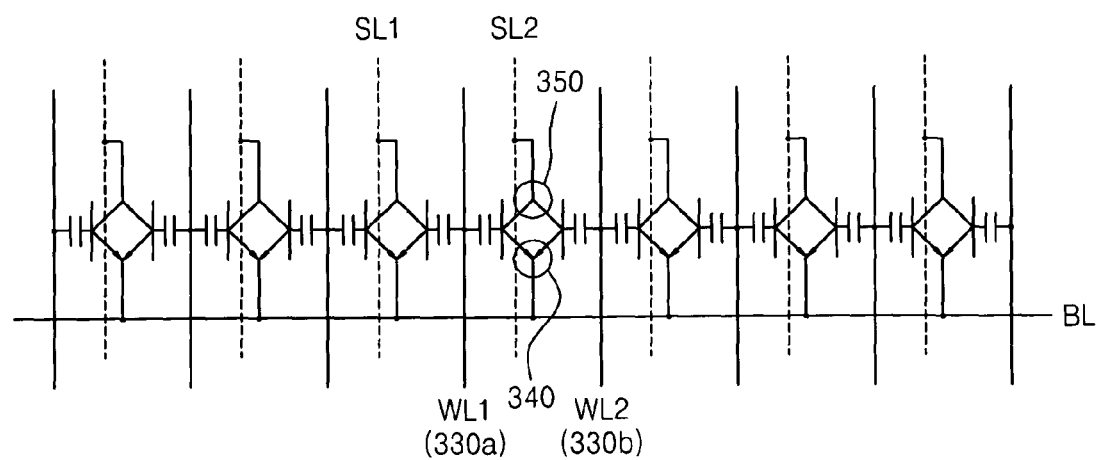

FIG. 8 is a circuit diagram of the semiconductor devices arranged on the array 30 illustrated in FIG. 7 according to example embodiments.

FIG. 8 shows a plurality of semiconductor devices connected to a bit line BL and word lines WL1 330a and WL2 330b.

Figure 9:
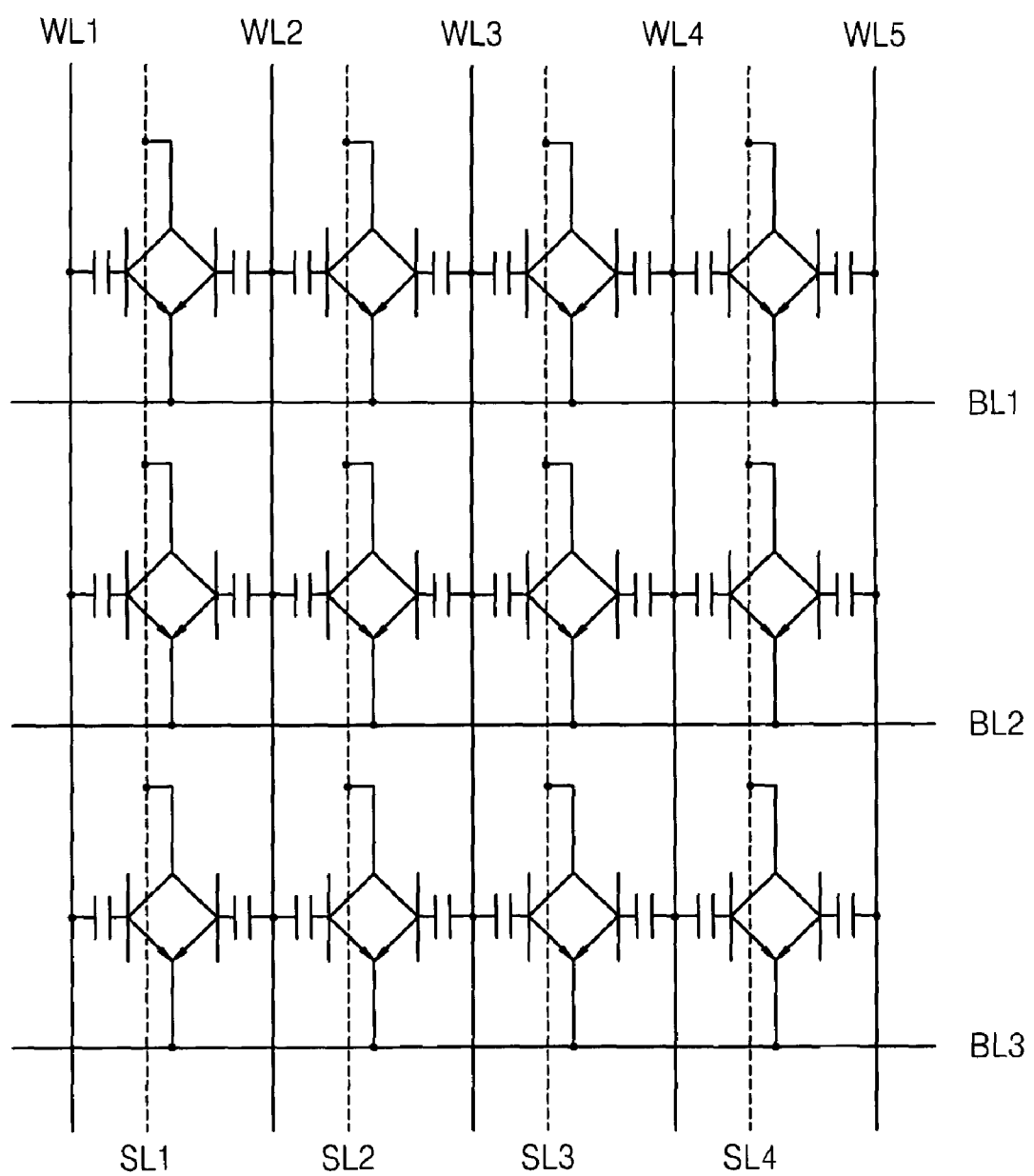

FIG. 9 is a circuit diagram of the semiconductor devices illustrated in FIG. 7 according to example embodiments.

FIG. 9 shows a plurality of semiconductor devices connected to a plurality of bit lines BL1, BL2 and BL3, a plurality of source lines SL1, SL2, SL3 and SL4, and a plurality of word lines WL1, WL2, WL3, WL4 and WL5.

In FIGS. 8 and 9, a circuit diagram similar to that shown in FIG. 4 is repeated. Thus, detailed descriptions thereof will be omitted for the sake of brevity.

Figure 10:
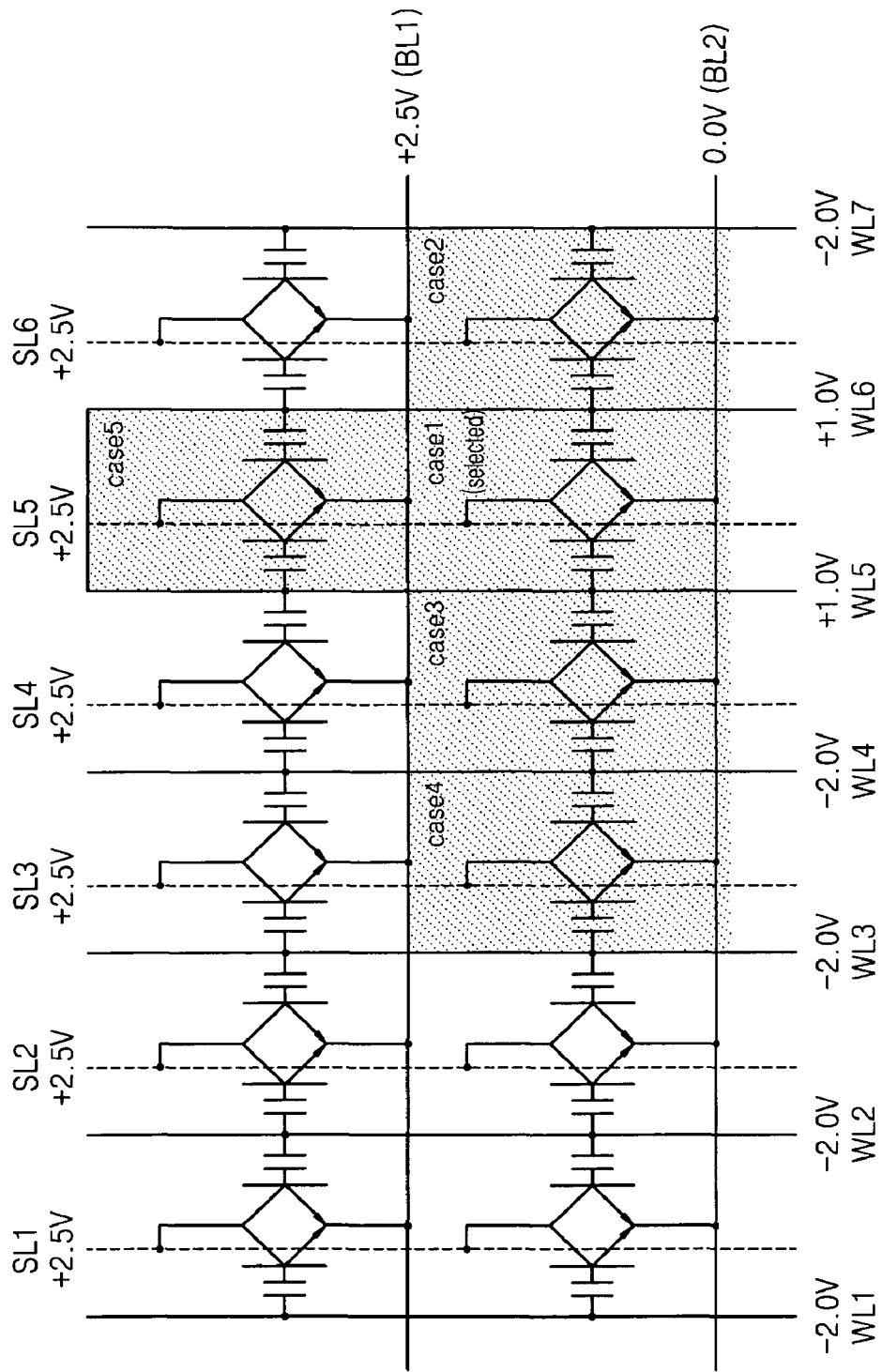
Figure 11:
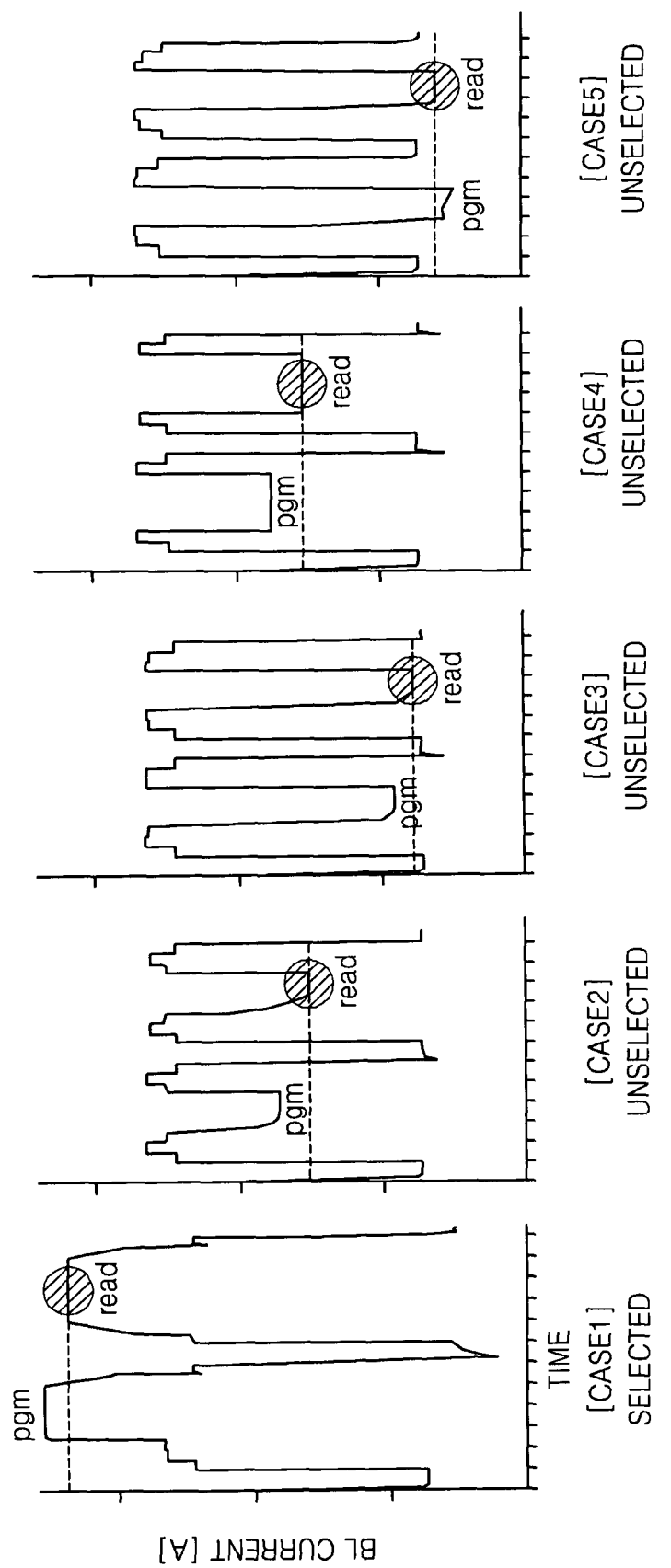

FIGS. 10 and 11 are diagrams for describing a method of programming and verifying a data '1' in a semiconductor device according to example embodiments.

Referring to FIG. 10, a semiconductor device marked as "case 1" is a target semiconductor device in which the data '1' is to be programmed. +1.0V may be applied to word lines WL5 and WL6 connected to the target semiconductor device and −2.0V may be applied to other word lines WL1 through WL4 and WL7. 0.0V may be applied to bit line BL2 connected to the target semiconductor device and +2.5V may be applied to bit line BL1. +2.5V may be applied to source lines SL1 through SL6.

Other semiconductor devices, which are marked as "case 2," "case 3," "case 4" and "case 5," are connected to the bit line BL2 or the word lines WL5 and WL6, which are connected to the target semiconductor device.

Referring to FIG. 11, in a first graph, the data '1' is programmed in and read from the target semiconductor device. In second through fifth graphs, the data '1' is not programmed in the other semiconductor devices marked as cases 2 through 5.

Figure 12:
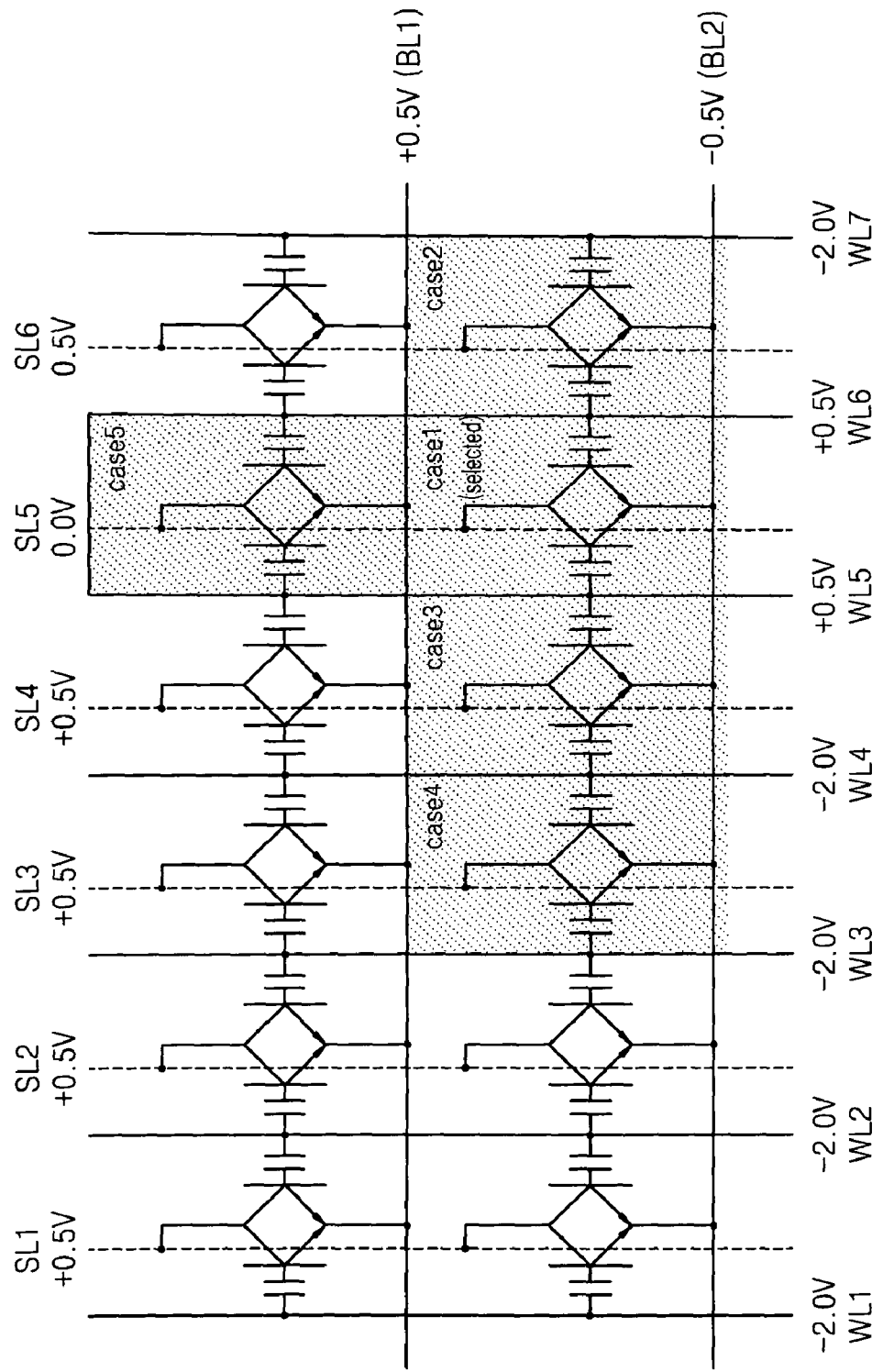
Figure 13:
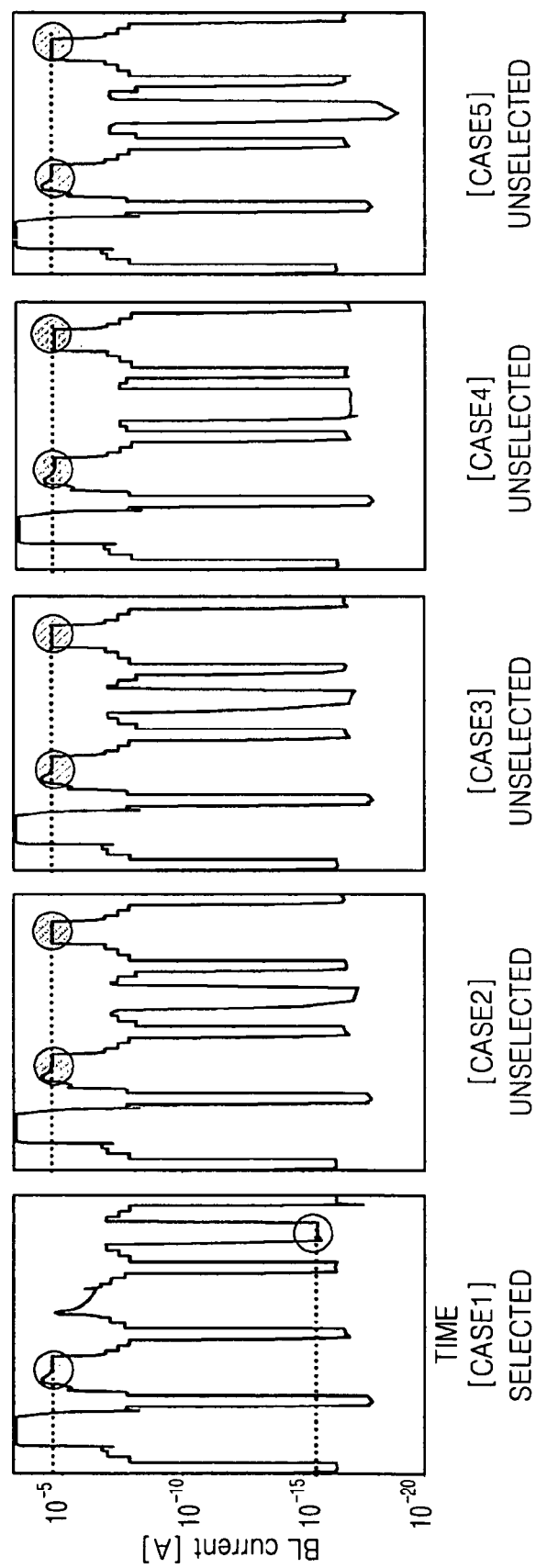

FIGS. 12 and 13 are diagrams for describing a method of programming and verifying a data '0' in a semiconductor device according to example embodiments.

Referring to FIG. 12, a semiconductor device marked as "case 1" may be a target semiconductor device in which the data '0' is to be programmed. +0.5V may be applied to word lines WL5 and WL6 connected to the target semiconductor device and −2.0V may be applied to word lines WL1 through WL4 and WL7. −0.5V may be applied to bit line BL2 connected to the target semiconductor device and +0.5V may be applied to bit line BL1. 0.0V may be applied to source line SL5 connected to the target semiconductor device and +0.5V may be applied to source lines SL1 through SL4 and SL6.

Other semiconductor devices, which are marked as "case 2," "case 3," "case 4" and "case 5," are connected to the bit line BL2 or the word lines WL5 and WL6 connected to the target semiconductor device.

Referring to FIG. 13, in a first graph, the data '0' is programmed in and read from the target semiconductor device. In second through fifth graphs, the data '0' is not programmed in the other semiconductor devices marked as cases 2 through 5.

The voltage levels of FIGS. 10 and 12 are exemplary voltage levels and different voltage levels may also be applied.

FIGS. 14A through 14F are diagrams for describing a method of manufacturing a semiconductor device 400 according to example embodiments.

Figure 14A:
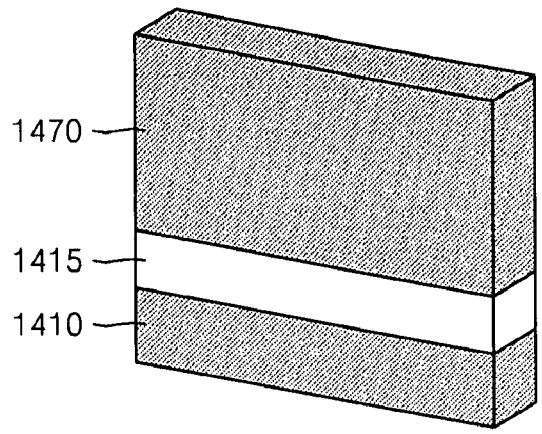
FIGS. 14A through 14F are diagrams for describing a method of manufacturing a semiconductor device 400 according to example embodiments.

Referring to FIG. 14A, a BOX region 1415 may be formed on a substrate region 1410. A body region 1470 may be formed on the BOX region 1415. The substrate region 1410 may be obtained from a bulk silicon substrate.

In other example embodiments, the body region 1470 may be formed on a silicon-on-insulator (SOI) substrate. The SOI substrate may be obtained by forming an insulator region on a silicon substrate. If the body region 1470 is formed on the SOI substrate, forming the BOX region 1415 may be omitted.

Figure 14B:
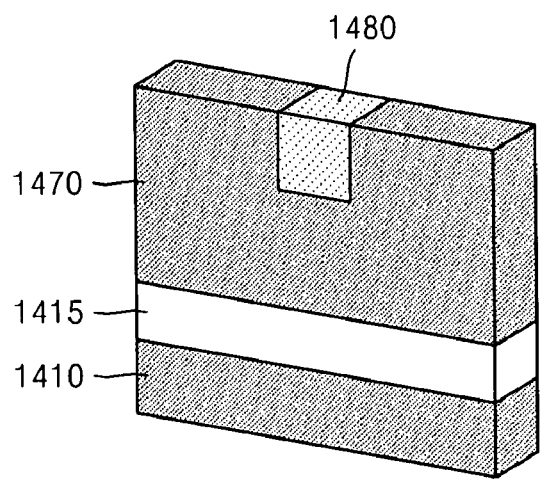

Referring to FIG. 14B, a blocking oxide region 1480 may be formed in a middle region of an upper surface of the body region 1470. The blocking oxide region 1480 may be formed by etching the middle region of the upper surface of the body region 1470 and filling the etched middle region with an oxide. Another insulation material may be filled in the etched middle region.

Figure 14C:
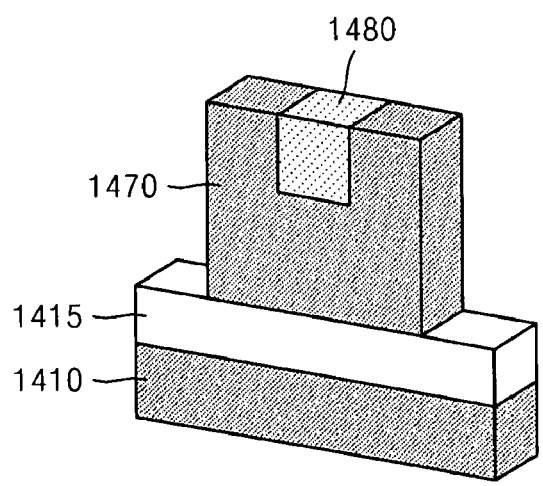

Referring to FIG. 14C, desired widths of both sides of the body region 1470 may be patterned, exposing upper and outer portions of the BOX region 1415.

Figure 14D:
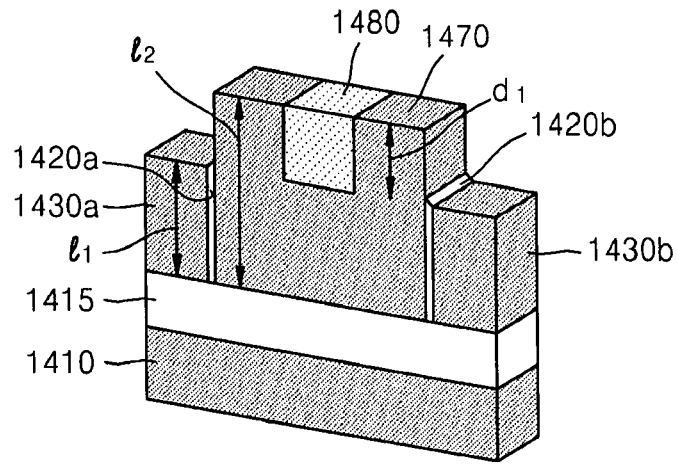

Referring to FIG. 14D, gate oxide regions 1420a and 1420b and gate patterns 1430a and 1430b may be formed on the exposed portions of the BOX region 1415. A length $l_1$ of the gate oxide regions 1420a and 1420b and the gate patterns 1430a and 1430b may be shorter than a length $l_2$ of the body region 1470 by a desired distance $d_1$ (or greater than the desired distance) in a direction extending perpendicular from substrate region 1410.

Figure 14E:
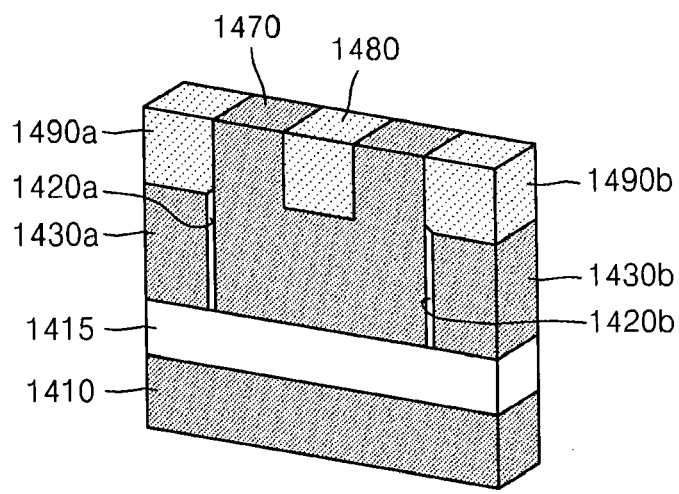

Referring to FIG. 14E, first oxide regions 1490a and 1490b may be formed on the gate oxide regions 1420a and 1420b and the gate patterns 1430a and 1430b. Upper potions of the first oxide regions 1490a and 1490b may be disposed at the same height as upper portions of the body region 1470.

Figure 14F:
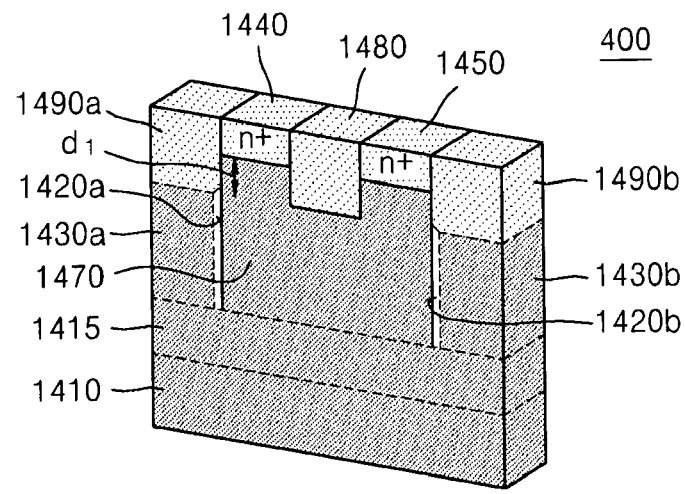

Referring to FIG. 14F, first and second impurity doped regions 1440 and 1450 may be formed in the upper portions of the body region 1470. The first and second impurity doped regions 1440 and 1450 may be separated from each other by the blocking oxide region 1480.

The first and second impurity doped regions 1440 and 1450 may be formed in the upper portions of the body region 1470 to a desired depth. The first and second impurity doped regions 1440 and 1450 may be separated from the gate patterns 1430a and 1430b by the desired distance $d_1$ (or greater than the desired distance) in a direction perpendicular to the gate patterns 1430a and 1430b. The first and second impurity doped regions 1440 and 1450 may not overlap with the gate patterns 1430a and 1430b.

In FIGS. 14A through 14F, the semiconductor device 400 includes the BOX region 1415. However, the method illustrated in FIGS. 14A through 14F may be used to manufacture the semiconductor device 300 illustrated in FIG. 3, which does not include a BOX region. It is obvious to one ordinary skill in the art that the semiconductor device 300 illustrated in FIG. 3 may be manufactured by omitting the forming of the BOX region 1415 from the method illustrated in FIGS. 14A through 14F. Thus, detailed descriptions thereof will be omitted.

Figure 15:
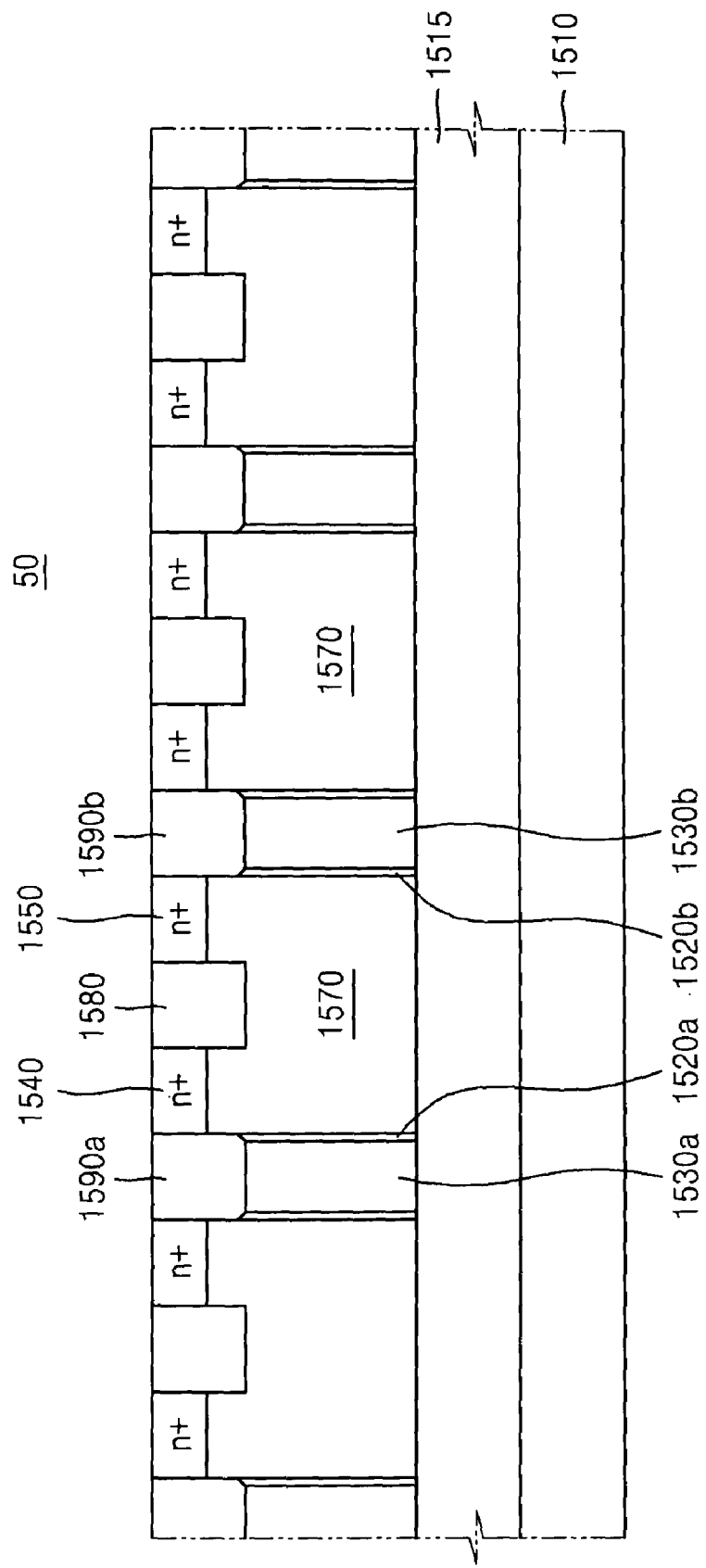

FIG. 15 is a front view of an array 50 of semiconductor devices according to example embodiments. The semiconductor devices shown in FIG. 15 are manufactured similar to semiconductor device 400 shown in FIGS. 14A-14F.

Referring to FIG. 15, a plurality of body regions 1570 and a plurality of gate patterns 1530a and 1530b may be disposed on a semiconductor substrate 1510. For convenience of explanation, a body region 1570 and gate patterns 1530a and 1530b will be representatively described. The body region 1570 may be disposed on the semiconductor substrate 1510 in the array 50. Each of the gate patterns 1530a and 1530b may be disposed between two body regions. Each of the gate patterns 1530a and 1530b may be shared by two (adjacent) body regions 1570. Each body region 1570 and the gate patterns 1530a and 1530b may function as a semiconductor device.

In FIG. 15, a BOX region 1515, gate oxide regions 1520a and 1520b, first oxide regions 1590a and 1590b, a blocking oxide region 1580, and first and second impurity doped regions 1540 and 1550 respectively correspond to the BOX region 1415, the gate oxide regions 1420a and 1420b, the first oxide regions 1490a and 1490b, the blocking oxide region 1480, and the first and second impurity doped regions 1440 and 1450 illustrated in FIGS. 14A through 14F. Thus, detailed description thereof will be omitted.

FIGS. 16A through 16F are diagrams for describing a method of manufacturing a semiconductor device 600 according to example embodiments.

Figure 16A:
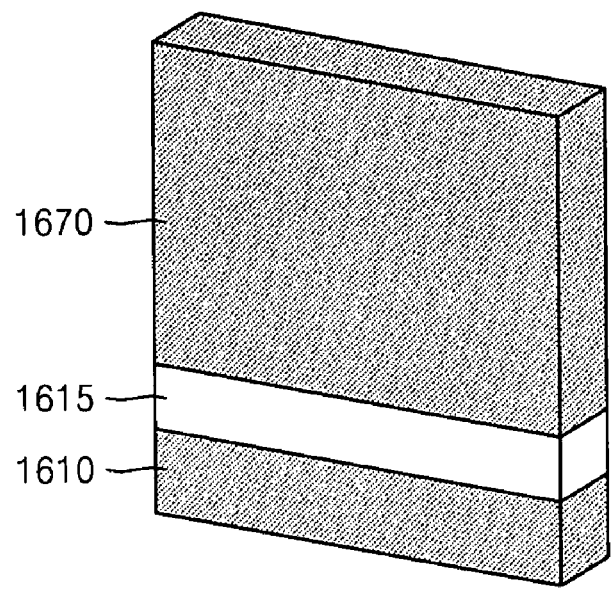
FIGS. 16A through 16F are diagrams for describing a method of manufacturing a semiconductor device 600 according to example embodiments.
Figure 16B:
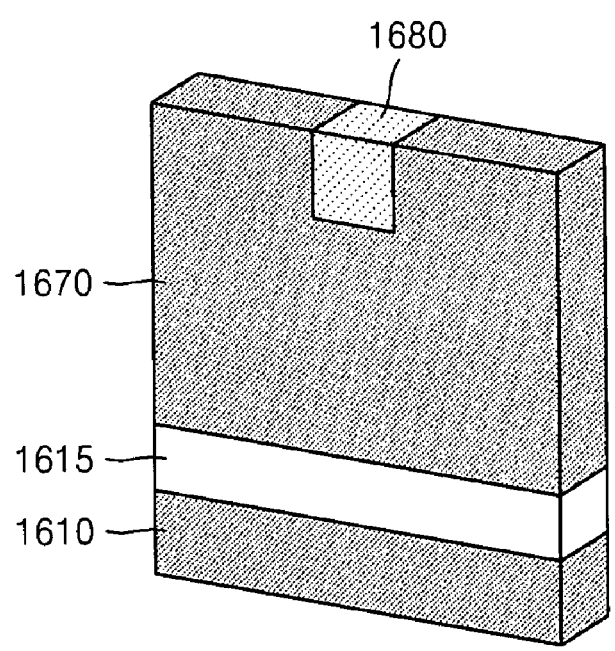

FIGS. 16A and 16B respectively correspond to FIGS. 14A and 14B and thus detailed descriptions thereof will be omitted.

Figure 16C:
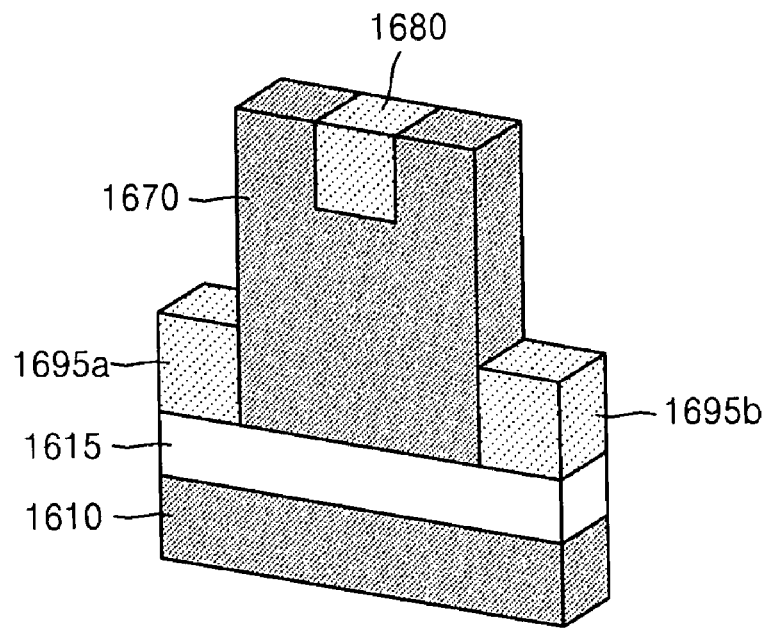

Referring to FIG. 16C, desired widths of both sides of a body region 1670 may patterned, exposing upper and outer portions of a BOX region 1615. Second oxide regions 1695a and 1695b may be formed on the exposed portions of the BOX region 1615.

Figure 16D:
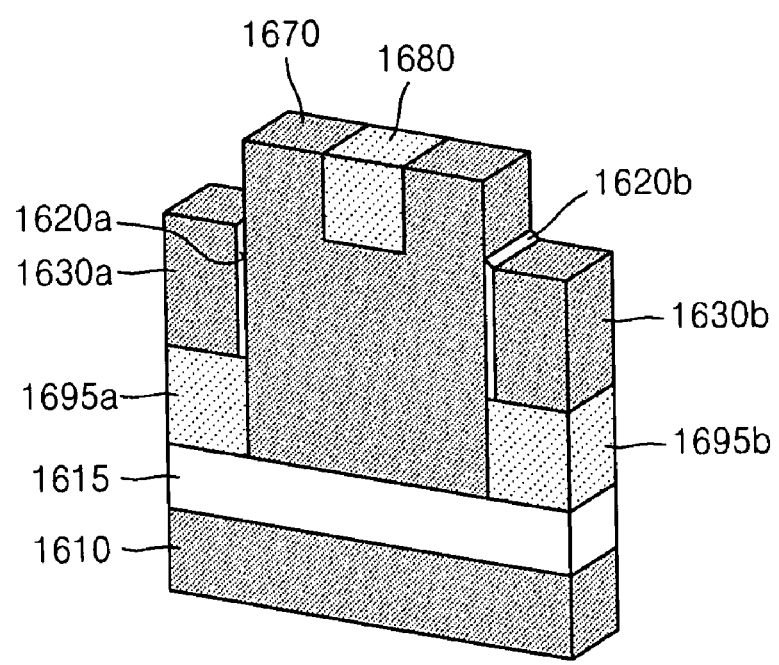

Referring to FIG. 16D, gate oxide regions 1620a and 1620b and gate patterns 1630a and 1630b may be formed on the second oxide regions 1695a and 1695b.

Figure 16E:
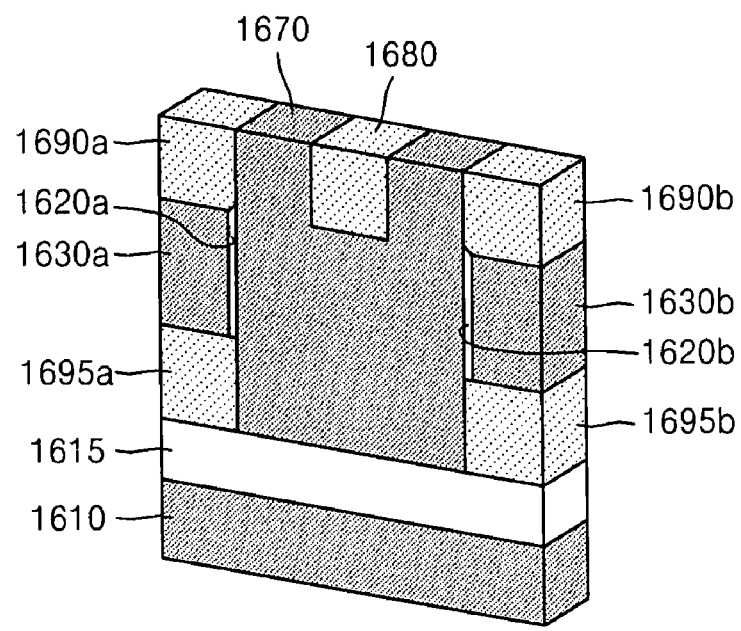

Referring to FIG. 16E, first oxide regions 1690a and 1690b may be formed on the gate oxide regions 1620a and 1620b and the gate patterns 1630a and 1630b. Upper potions of first oxide regions 1690a and 1690b may be disposed at the same height as upper portions of the body region 1670.

In FIG. 14E, the gate patterns 1430a and 1430b are formed on the BOX region 1415. In FIG. 16E, the second oxide regions 1695a and 1695b are formed on the BOX region 1615. The gate patterns 1630a and 1630b are formed on the second oxide regions 1695a and 1695b.

Figure 16F:
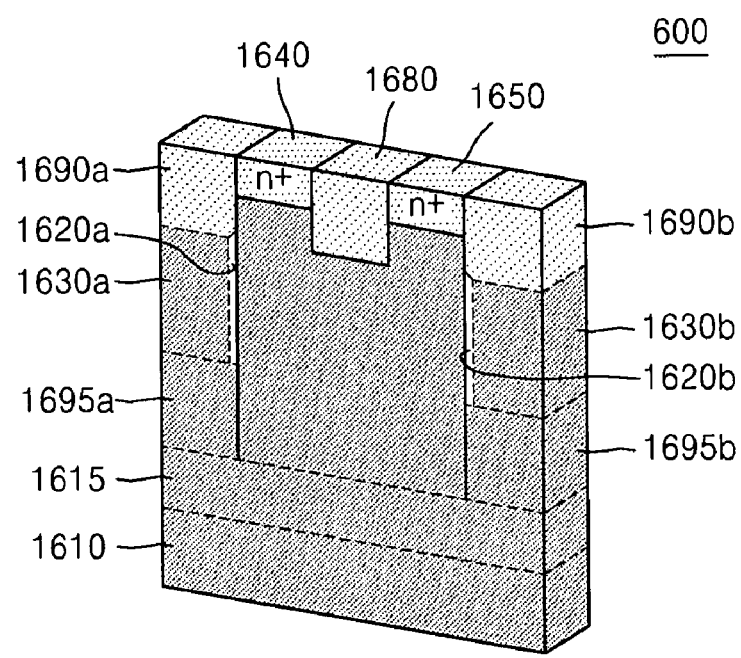

Referring to FIG. 16F, first and second impurity doped regions 1640 and 1650 may be formed in the upper portions of the body region 1670.

The method illustrated in FIGS. 16A through 16F may used to manufacture the semiconductor device 300 illustrated in FIG. 3, which does not include a BOX region.

Figure 17:
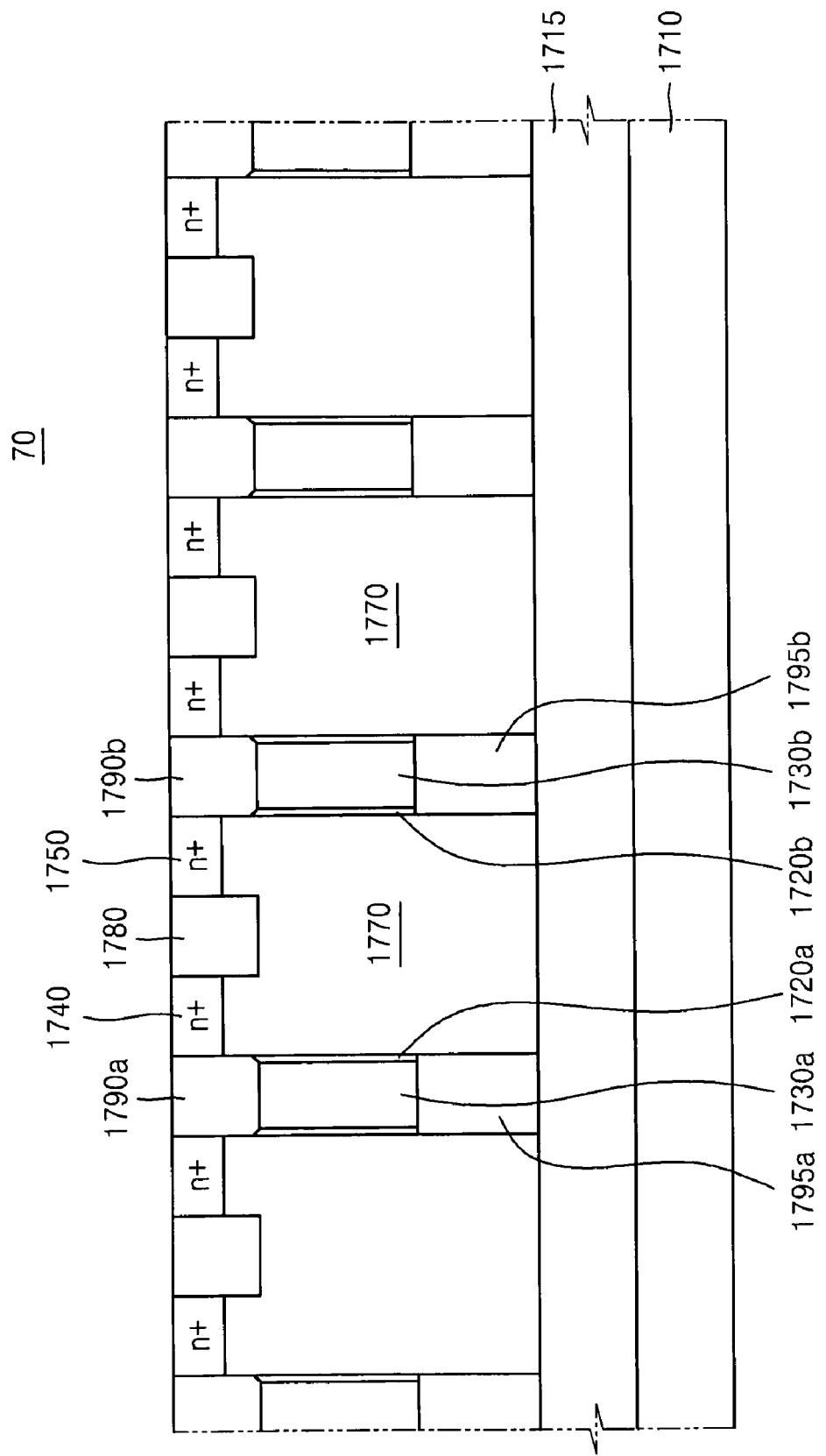

FIG. 17 is a front view of an array 70 of semiconductor devices according to example embodiments. The semiconductor devices shown in FIG. 17 are manufactured similar to semiconductor device 600 shown in FIGS. 16A-16F. Thus, like reference numerals used in FIGS. 16A-16F and FIG. 17 denote like elements.

Except for gate patterns 1730a and 1730b being formed on second oxide regions 1795a and 1795b, the array 70 illustrated in FIG. 17 is similar to the array 50 illustrated in FIG. 15. Thus, detailed descriptions thereof will be omitted.

FIGS. 18A through 18I are diagrams for describing a method of manufacturing a semiconductor device 800 according to example embodiments.

Referring to FIGS. 18A through 18E, a body region 1870 is formed on a substrate region 1810. The body region 1871 is separated from the substrate region 1810 by using a selective etching method.

Figure 18A:
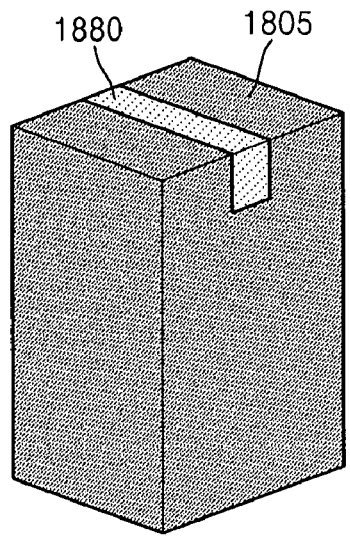
FIGS. 18A through 18I are diagrams for describing a method of manufacturing a semiconductor device 800 according to example embodiments.

Referring to FIG. 18A, a blocking oxide region 1880 may be formed by etching a middle region of an upper surface of a bulk substrate 1805 and filling the etched middle region with an oxide. Any insulation material known in the art may be filled in the etched middle region.

Figure 18B:
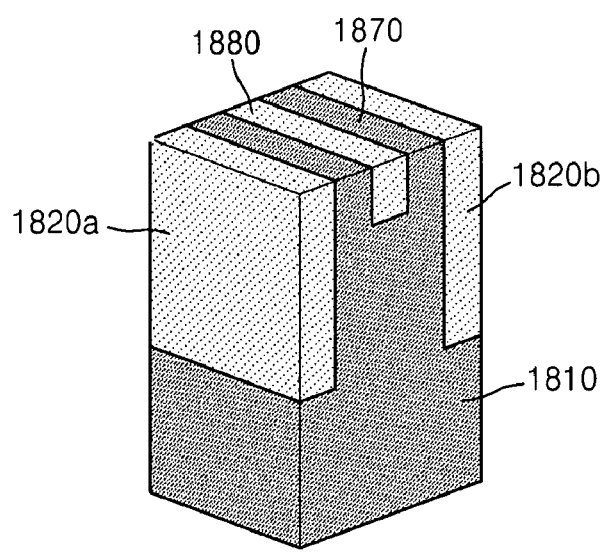

Referring to FIG. 18B, a body line pattern 1870 extending in a long axis direction may be formed by etching both sides of the bulk substrate 1805 illustrated in FIG. 18A in the long axis direction. Gate oxide regions 1820a and 1820b may be formed by filling both sides of the body line pattern 1870 with an oxide. An unetched region of the bulk substrate 1805 is referred to as the substrate region 1810.

Figure 18C:
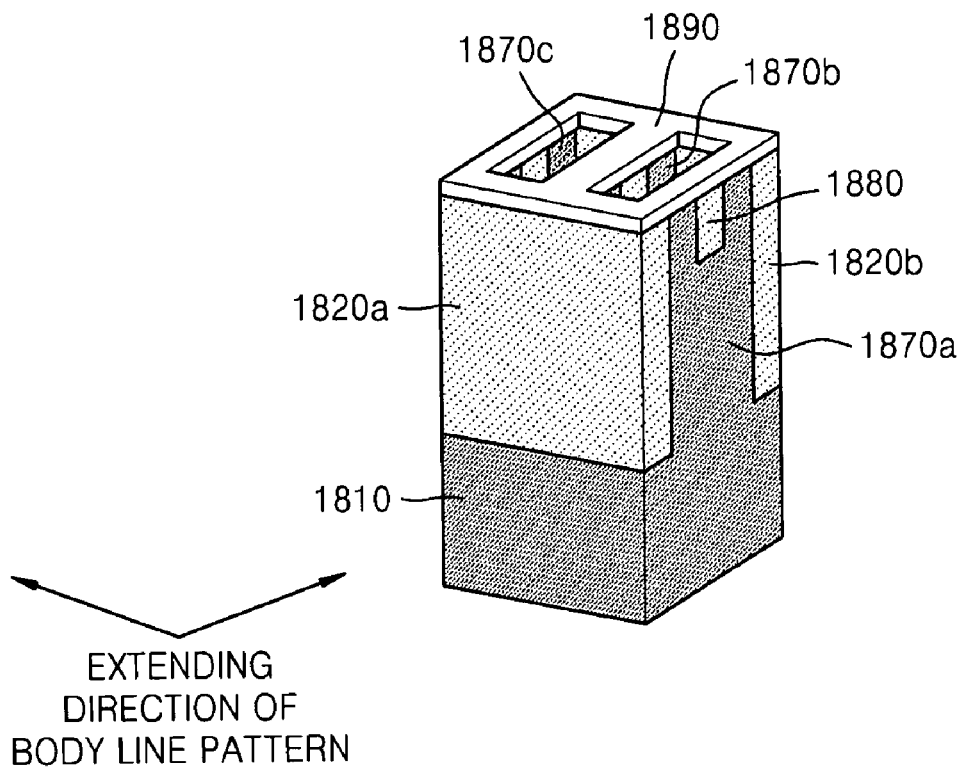

Referring to FIG. 18C, the body line pattern 1870 and the blocking oxide region 1880 may be patterned in a short axis direction. A plurality of body patterns 1870a, 1870b, and 1870c may be formed by etching the body line pattern 1870 and the blocking oxide region 1880 in a direction perpendicular to an extending direction of the body line pattern 1870 illustrated in FIG. 18B. The gate oxide regions 1820a and 1820b are not etched.

Figure 18D:
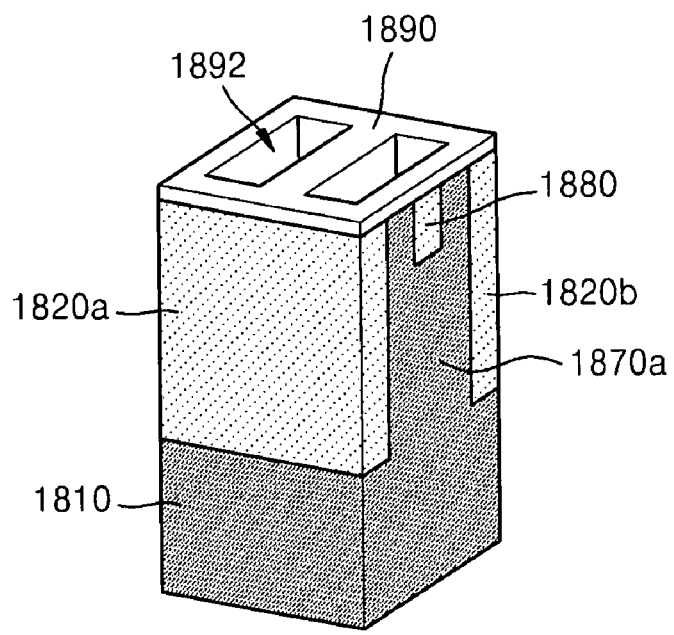

A mask 1890 may be covered on the gate oxide regions 1820a and 1820b and portions of the body line pattern 1870, which are not to be patterned. Portions where the mask 1890 is not covered may be patterned. Referring to FIG. 18D, internal surfaces 1892 and bottom surfaces (not shown) of the patterned portions may be masked. The masking of the bottom surfaces may be removed.

Figure 18E:
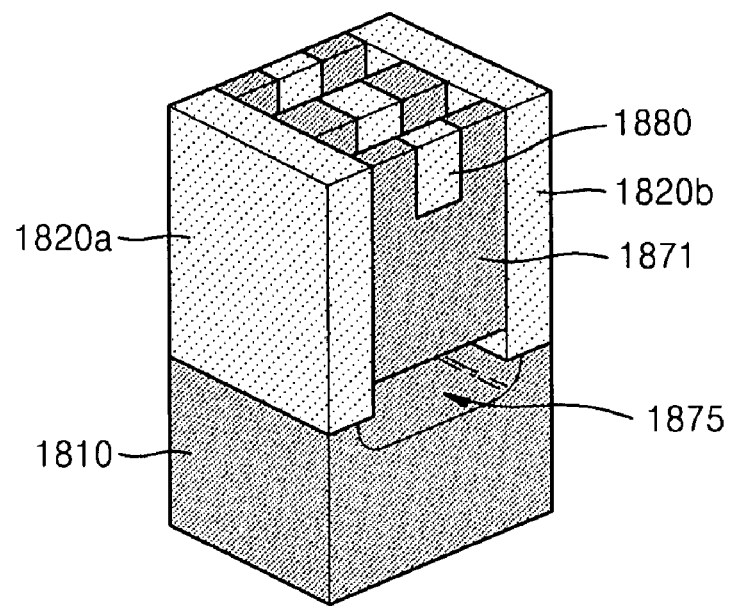

Referring to FIG. 18E, lower portions of the body patterns 1870a, 1870b and 1870c may be selectively etched through the bottom surfaces from which the masking is removed. In FIG. 18E, an empty space 1875 may be exposed after the lower portions of the body patterns 1870a, 1870b and 1870c are selectively etched.

Reference numeral 1870 is referred to as a body line pattern before being separated from the substrate region 1810 and reference numeral 1871 refers to a body region, which is the body line pattern 1870 after being separated from the substrate region 1810.

Figure 18F:
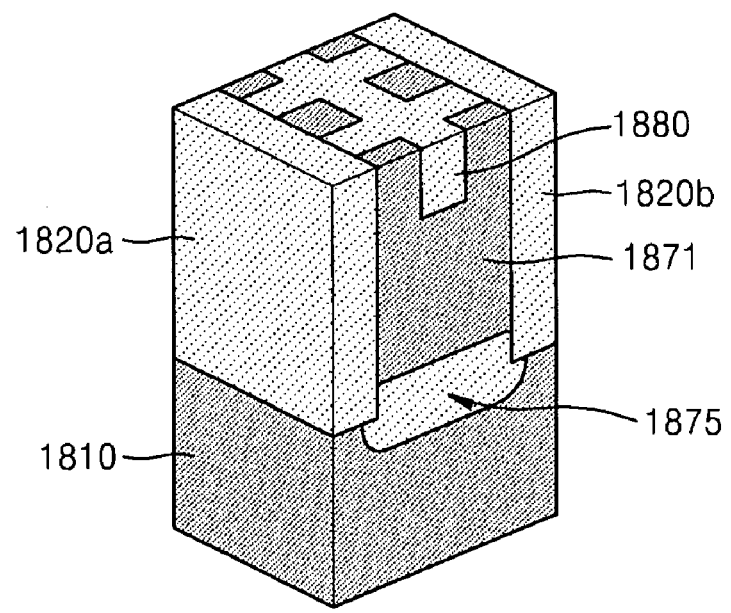

Referring to FIG. 18F, the empty space 1875 between the substrate region 1810 and the body patterns 1870a, 1870b, and 1870c may be filled with an oxide.

Figure 18G:
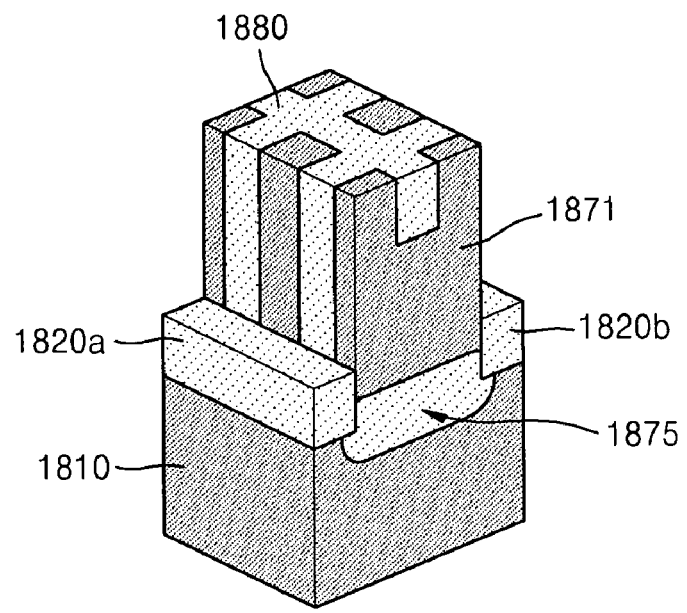
Figure 18H:
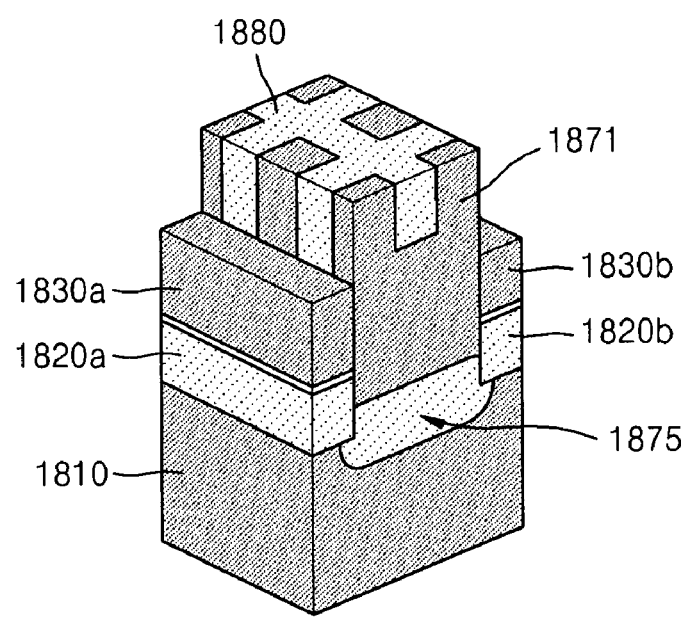
Figure 18I:
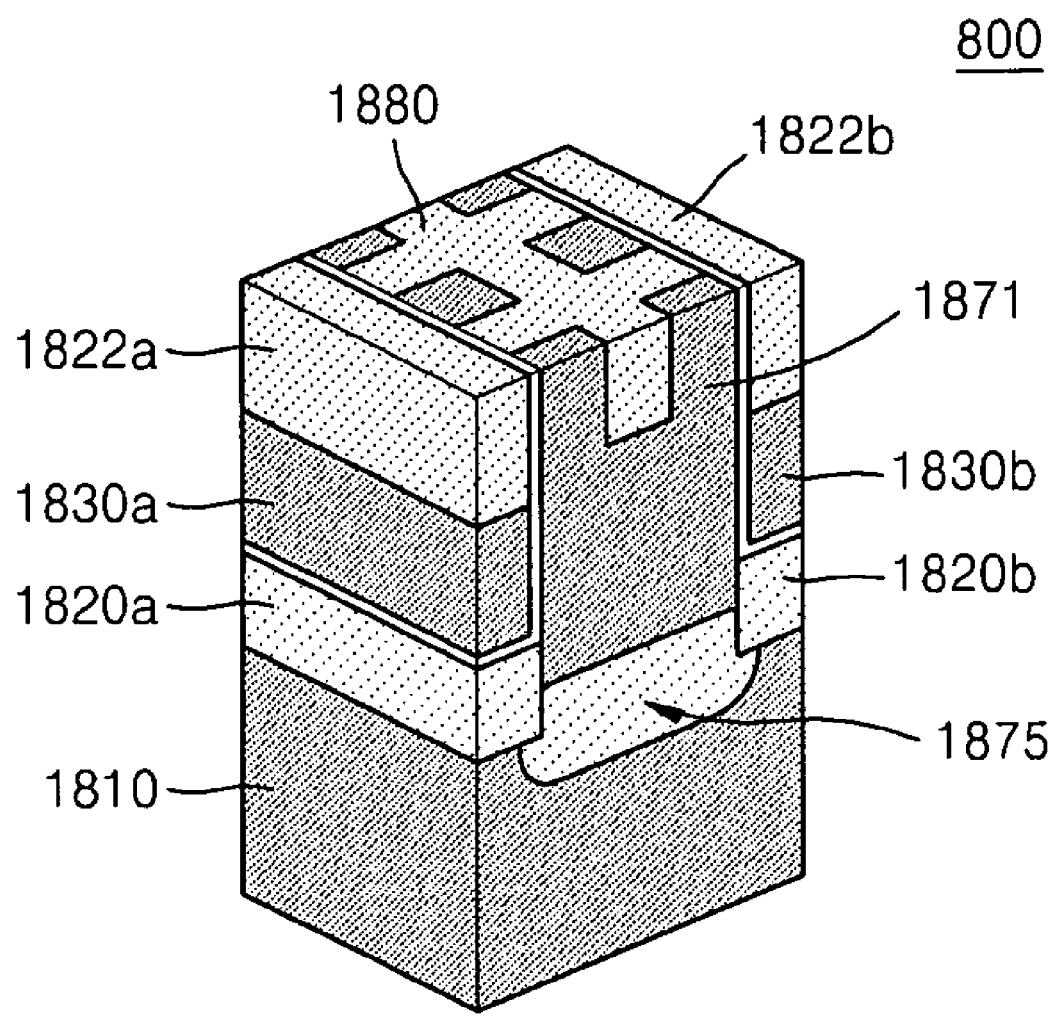

Referring to FIGS. 18G, 18H, and 18I, upper portions of the gate oxide regions 1820a and 1820b, which are formed on both sides of the body region 1871, are etched. Word line patterns 1830a and 1830b may be formed on the etched upper portions of the gate oxide regions 1820a and 1820b. Oxide regions 1822a and 1822b may be formed on the word line patterns 1830a and 1830b.

Figure 19:
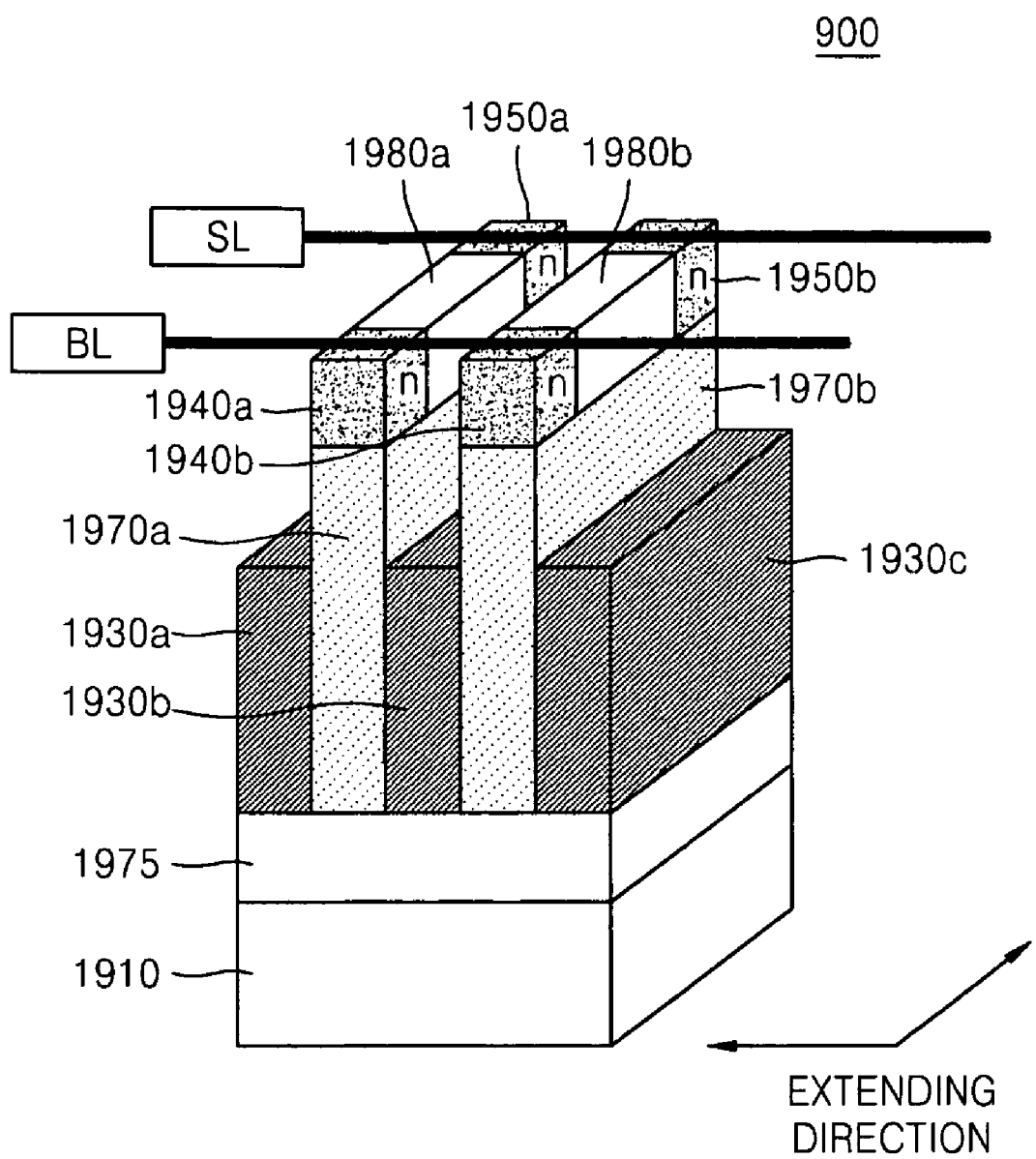

FIG. 19 is a perspective view of a semiconductor device 900 according to example embodiments.

Referring to FIG. 3, the gate patterns 330a and 330b extend in a direction perpendicular to a wide surface (or width) of the body region 370. Referring to FIG. 19, gate patterns 1930a, 1930b, and 1930c extend in a direction parallel to a wide surface (or width) of each body region 1970a and 1970b.

In the semiconductor device 900, a bit line BL and a source line SL are formed on impurity doped regions 1940a, 1940b, 1950a and 1950b. The bit line BL and the source line SL may formed in a direction perpendicular to the gate patterns 1930a, 1930b, and 1930c and the wide surface (or width) of each body region 1970a and 1970b.

Figure 20:
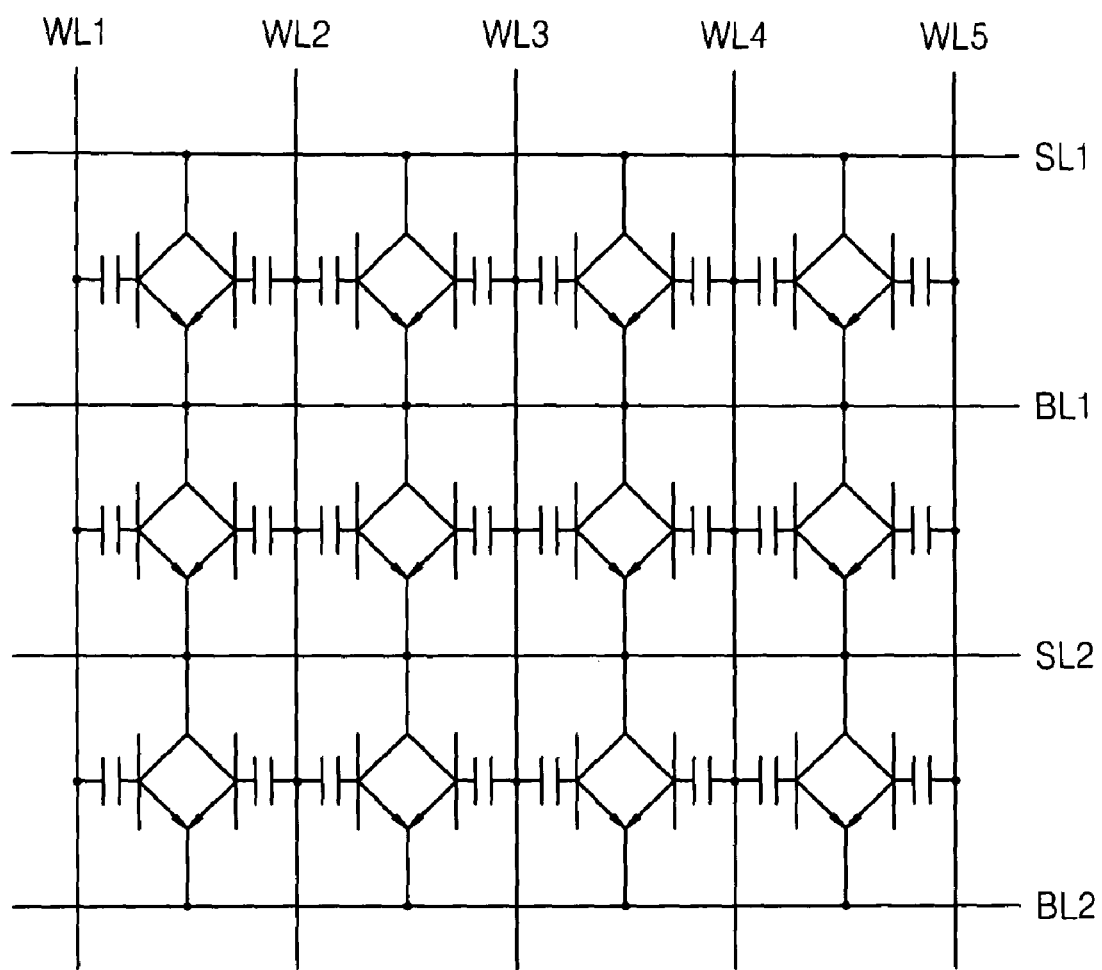

FIG. 20 is a circuit diagram of an array of semiconductor devices according to example embodiments. The semiconductor devices shown in FIG. 20 are similar to semiconductor device 900 shown in FIG. 19.

Referring to FIG. 20, bit lines BL1 and BL2 and source lines SL1 and SL2 may be alternately disposed. As described above with reference to FIGS. 7 and 15, word lines WL1 through WL5 are shared by the semiconductor devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   a body region over a semiconductor substrate;
   at least two gate patterns on the semiconductor substrate, the at least two gate patterns being on opposing sides of the body region; and
   a first impurity doped region and a second impurity doped region, both on an upper surface of the body region,
   wherein an upper surface of the at least two gate patterns is separated from a bottom surface of the first and second impurity doped regions by a distance greater than zero.

2. The semiconductor device of claim 1, further comprising a blocking insulation region between the first and second impurity doped regions, the first and second impurity doped regions protruding from an upper surface of the body region and the first and second impurity doped regions being separated from each other by a desired distance.

3. The semiconductor device of claim 1, wherein the at least two gate patterns are each shared by adjacent devices of a semiconductor apparatus.

4. The semiconductor device of claim 1, wherein the first and second impurity doped regions are connected to a source line and a bit line, respectively, or the bit line and the source line, respectively.

5. The semiconductor device of claim 1, wherein the semiconductor device is a bipolar junction transistor (BJT), the at least two gate patterns being base regions of the BJT, and
the first and second impurity doped regions are emitter and source regions, respectively, or the source and emitter regions, respectively, of the BJT.

6. The semiconductor device of claim 1, further comprising at least two gate insulation regions, each between the body region and one of the at least two gate patterns.

7. The semiconductor device of claim 1, further comprising a buried oxide (BOX) insulation region between the semiconductor substrate and the body region.

8. The semiconductor device of claim 7, further comprising a plurality of first insulation regions each on one of the at least two gate patterns, the at least two gate patterns being on the BOX insulation region.

9. The semiconductor device of claim 7, further comprising:
a plurality of first insulation regions on the BOX insulation region; and
a plurality of second insulation regions on the plurality of first insulation regions, the at least two gate patterns being disposed between the plurality of first and second insulation regions.

10. The semiconductor device of claim 1, wherein the at least two gate patterns extend in a direction perpendicular to a width of the body region.

11. The semiconductor device of claim 1, wherein the at least two gate patterns extend in a direction parallel to a width of the body region.

12. The semiconductor device of claim 1, wherein the body region is a floating body region separated from the semiconductor substrate, the body region and the semiconductor substrate being formed of materials having the same characteristics.

13. The semiconductor device of claim 12, further comprising an insulation region between the body region and the semiconductor substrate such that the body region is separated from the semiconductor substrate.

14. A semiconductor apparatus, comprising:
a plurality of semiconductor devices according to claim 1.

15. The semiconductor apparatus of claim 14, wherein the at least two gate patterns in each of the semiconductor devices extend in a direction parallel to a width of the body region.

16. The semiconductor apparatus of claim 14, further comprising a blocking insulation region between the first and second impurity doped regions, the first and second impurity doped regions protruding from an upper surface of each body region and being separated from each other by a desired distance.

17. The semiconductor apparatus of claim 14, wherein each of the at least two gate patterns in each of the plurality of semiconductor devices is shared by two body regions adjacent to the gate pattern.

18. The semiconductor apparatus of claim 14, wherein the first and second impurity doped regions are connected to a source line and a bit line, respectively, or the bit line and the source line, respectively.

19. The semiconductor apparatus of claim 18, wherein the bit line and the source line extend in a direction parallel to a width of the body region, the bit line and the source line being on the body region.

20. The semiconductor apparatus of claim 14, wherein the semiconductor apparatus is a bipolar junction transistor (BJT), the at least two gate patterns in each of the semiconductor devices functioning as base regions of the BJT, and
the first and second impurity doped regions are emitter and source regions, respectively, or the source and emitter regions, respectively, of the BJT.

\* \* \* \* \*